United States Patent
Shieh et al.

(10) Patent No.: US 9,985,657 B2
(45) Date of Patent: May 29, 2018

(54) MEMORY CONTROL MODULE AND CONTROL METHOD

(71) Applicant: REALTEK SEMICONDUCTOR CORPORATION, Hsinchu (TW)

(72) Inventors: Shin-Lin Shieh, Hsinchu County (TW); Szu-Chun Wang, New Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 237 days.

(21) Appl. No.: 14/965,723

(22) Filed: Dec. 10, 2015

(65) Prior Publication Data

US 2016/0241273 A1 Aug. 18, 2016

(30) Foreign Application Priority Data

Feb. 13, 2015 (TW) .............................. 104105187 A

(51) Int. Cl.

| | |
|---|---|
| *H03M 13/00* | (2006.01) |
| *H03M 13/29* | (2006.01) |
| *H03M 13/37* | (2006.01) |
| *G06F 11/10* | (2006.01) |
| H03M 13/11 | (2006.01) |
| H03M 13/15 | (2006.01) |

(52) U.S. Cl.
CPC ..... *H03M 13/2906* (2013.01); *G06F 11/1012* (2013.01); *H03M 13/3746* (2013.01); *H03M 13/6516* (2013.01); *H03M 13/6561* (2013.01); *H03M 13/1102* (2013.01); *H03M 13/152* (2013.01)

(58) Field of Classification Search
CPC ......... H03M 13/2906; H03M 13/1102; H03M 13/152; H03M 13/3746; H03M 13/6516; H03M 13/6561; G06F 11/1076
See application file for complete search history.

(56) References Cited

U.S. PATENT DOCUMENTS

| | | | |
|---|---|---|---|
| 2012/0240006 A1* | 9/2012 | Hu ...................... | H03M 13/253 714/756 |
| 2013/0166988 A1* | 6/2013 | Sharon ................ | G06F 11/1012 714/758 |
| 2016/0094247 A1* | 3/2016 | Parthasarathy ..... | H03M 13/152 714/755 |

OTHER PUBLICATIONS

Kim et al. "Improved hard-decision decoding LDPC Codec IP design," IEEE, pp. 416-419; May 20-23, 2012.*

(Continued)

*Primary Examiner* — Guy Lamarre
(74) *Attorney, Agent, or Firm* — WPAT, PC

(57) ABSTRACT

This invention discloses a memory control module and its associated control method. The memory control module includes a storage unit, an ECC unit, and a read/write control unit. The storage unit is to store a target data. The ECC unit includes multiple first encoders and a second encoder. The first encoders perform an encoding operation on the target data and generate multiple first sets of parity check bits, which comprise at least two lengths. The second encoder performs an encoding operation on the target data and the multiple first sets of parity check bits and generates a second set of parity check bits. The read/write control module converts the target data, the first sets of party check bit sets and the second set of parity check bits into a data format of a memory module.

14 Claims, 12 Drawing Sheets

(56) References Cited

OTHER PUBLICATIONS

Chen, P.H. et al., "BCH code selection and iterative decoding for BCH and LDPC concatenate coding system," IEEE Commun.Lett., vol. 17, pp. 980-983, May 2013.
Shieh, Shin-Lin, "Concatenated BCH and LDPC Coding Scheme with Iterative Decoding Algorithm for Flash Memory", IEEE Communications Letters, 2015.

* cited by examiner

MEMORY CONTROL MODULE AND CONTROL METHOD

BACKGROUND OF THE INVENTION

1. Field of the Invention

The present invention relates to a memory control module and its associated control method, especially to a memory control module and the associated control method employing an LDPC (Low Density Parity Check) encoder/decoder concatenated with multiple BCH (Bose-Chaudhuri-Hocquenghem) encoders/decoders of different code lengths.

2. Description of Related Art

ECCs are widely used in digital data related systems or devices, such as communication systems, storage devices, etc., and the BCH code and the LDPC code are two common kinds of ECCs. FIG. 1A shows a prior art ECC encoder comprising an LDPC encoder concatenated with multiple BCH encoders. The ECC encoding circuit 100 includes n BCH encoders 110-1~110-n and an LDPC encoder 120. Each BCH encoder 110 has the same code length. The BCH encoder 110 encodes the target data D0 to generate the data D1, which includes the target data D0 and multiple sets of BCH code parity check bits. Each set of BCH code parity check bits corresponds to a BCH encoder 110. Then the LDPC encoder 120 encodes the data D1 to generate the data D2, which includes the target data D0, the multiple sets of BCH code parity check bits and one set of LDPC code parity check bits. FIG. 1B shows an ECC decoder corresponding to the ECC encoder of FIG. 1A. The ECC decoder 150 includes n BCH decoders 160-1~160-n, and an LDPC decoder 170. Likewise, the n BCH decoders 160 have the same code length, which is identical to the code length of the BCH encoders 110. The LDPC decoder 170 receives the data D2', which corresponds to the data D2 but may contain several error bits, and corrects the error bits according to the set of LDPC code parity check bits included in the data D2' to generate the data D1'. Each BCH decoder 160 decodes the data D1' to correct the residual error bits. Finally, the data D0' will be obtained, which will be identical to the target data D0 if all error bits are corrected.

The LDPC code has a shortcoming that there exists an error floor region in a figure illustrating the relationship between the bit error rate (BER) and the signal to noise ratio (SNR), which implies that the error correcting capability of the LDPC code is limited. Therefore, the ECC decoder 150 employs multiple BCH decoders 160 having different characteristics but the same code length to enhance the chance of successfully correcting the residual error bits. In addition to reducing the BER, such design also obscures the error floor region of the LDPC code. However, as the same code length is used by all BCH encoders 110 and all BCH decoders 160, each BCH encoder 110 or BCH decoder 160 processes the BCH code parity check bits of the same length, which limits the performance of the ECC encoding/decoding circuit.

SUMMARY OF THE INVENTION

In view of the problems of the prior art, an object of the present invention is to provide a memory control module and its associated control method, so as to make an improvement to the prior art.

The present invention discloses a memory control module for controlling a memory module, which comprising a storage unit, an ECC unit, and a read/write control unit. The storage unit is for storing a target data. The ECC unit, which is coupled to the storage unit, comprises a plurality of first encoders and a second encoder. The first encoders encode the target data to generate multiple first sets of parity check bits. The multiple first sets of parity check bits comprise at least two lengths. The second encoder, which is coupled to the first encoders, encodes the target data to generate a second set of parity check bits. The read/write control unit, which is coupled to the ECC unit, converts the target data, the multiple first sets of parity check bits and the second set of parity check bits into a data format of the memory module.

The present invention also discloses a control method for controlling a memory module, comprising: storing a target data; using a first encoding method to encode the target data to generate multiple first sets of parity check bits, wherein the multiple sets of parity check bit have at least two lengths; using a second method to encode the target data to generate a second set of parity check bits; and converting the target data, the multiple first sets of parity check bits and the second set of parity check bits into a data format of the memory module.

The memory control module and its associated control method of this invention use BCH encoders/decoders of different code lengths to perform the BCH code encoding/decoding operations, which presents lower BER as compared to a conventional ECC encoding/decoding circuit.

These and other objectives of the present invention no doubt becomes obvious to those of ordinary skill in the art after reading the following detailed description of the preferred embodiments that are illustrated in the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1A:
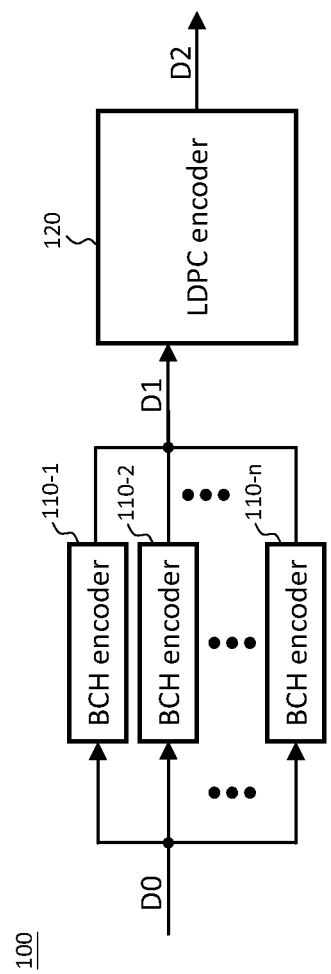
FIG. 1A illustrates a prior art ECC encoder comprising an LDPC encoder concatenated with multiple BCH encoders.
Figure 1B:
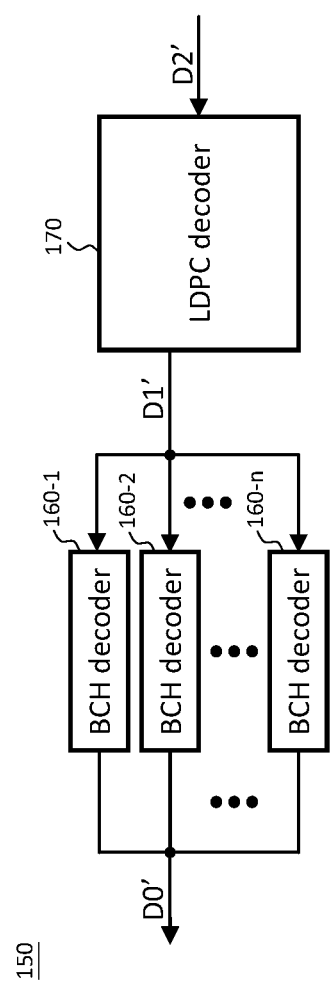
FIG. 1B illustrates an ECC decoder corresponding to the ECC encoder of FIG. 1A.
Figure 2:
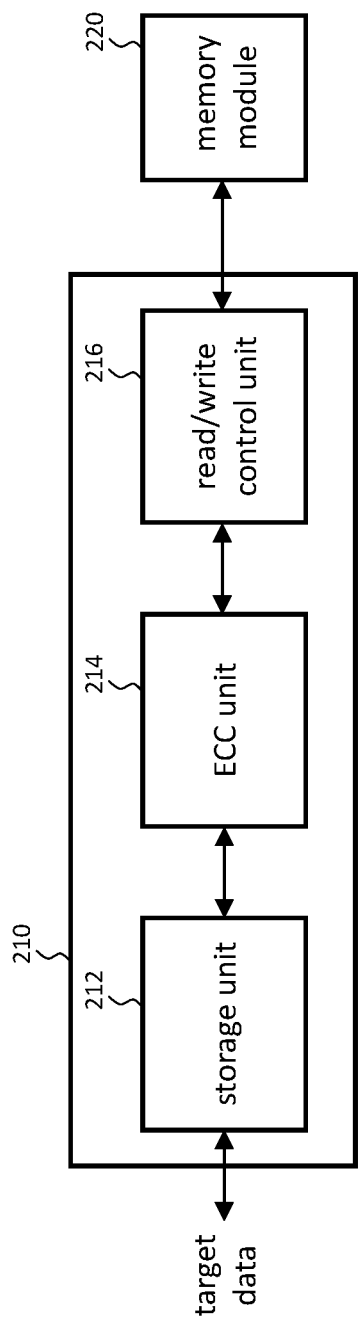
FIG. 2 illustrates a functional block diagram of a memory control module of this invention.

As data errors, caused by environmental factors such as temperatures and voltages, may occur while the memories are being accessed, the ECC encoding/decoding methods are commonly used to decrease the data error rate. FIG. 2 illustrates a functional block diagram of a memory control module of this invention. The memory control module 210, which includes a storage unit 212, an ECC unit 214 and a read/write control unit 216, acts to control the data access of the memory module 220. For example, the memory module 220 can be a memory module of a flash memory, a solid state drive (SSD), etc. The target data can be sent to the memory control module 210 through a PCI (Peripheral Component Interconnect) bus, a PCI Express bus, a serial ATA (Advanced Technology Attachment) bus or a USB (Universal Serial Bus). As the target data are being written into the memory module 220, the target data are temporarily stored in the storage unit 212 before the ECC unit 214 calculates the parity check bits of the target data. Then, the target data, along with the parity check bits, are converted into signal formats of the memory module 220 by the read/write control unit 216 before being written into the memory module 220. In a read process, the data are read from the memory module 220 by the read/write control unit 216, and the read data includes the previously stored target data and the parity check bits. There might be errors in the read data because of interferences from noises, temperatures and defects in the memory module 220 itself. After the target data, along with the parity check bit, are converted by the read/write control unit 216, the ECC unit 214 performs error correcting operations on the data according to the parity check bits. The corrected target data are temporarily stored in the storage unit 212 before output.

Figure 3:
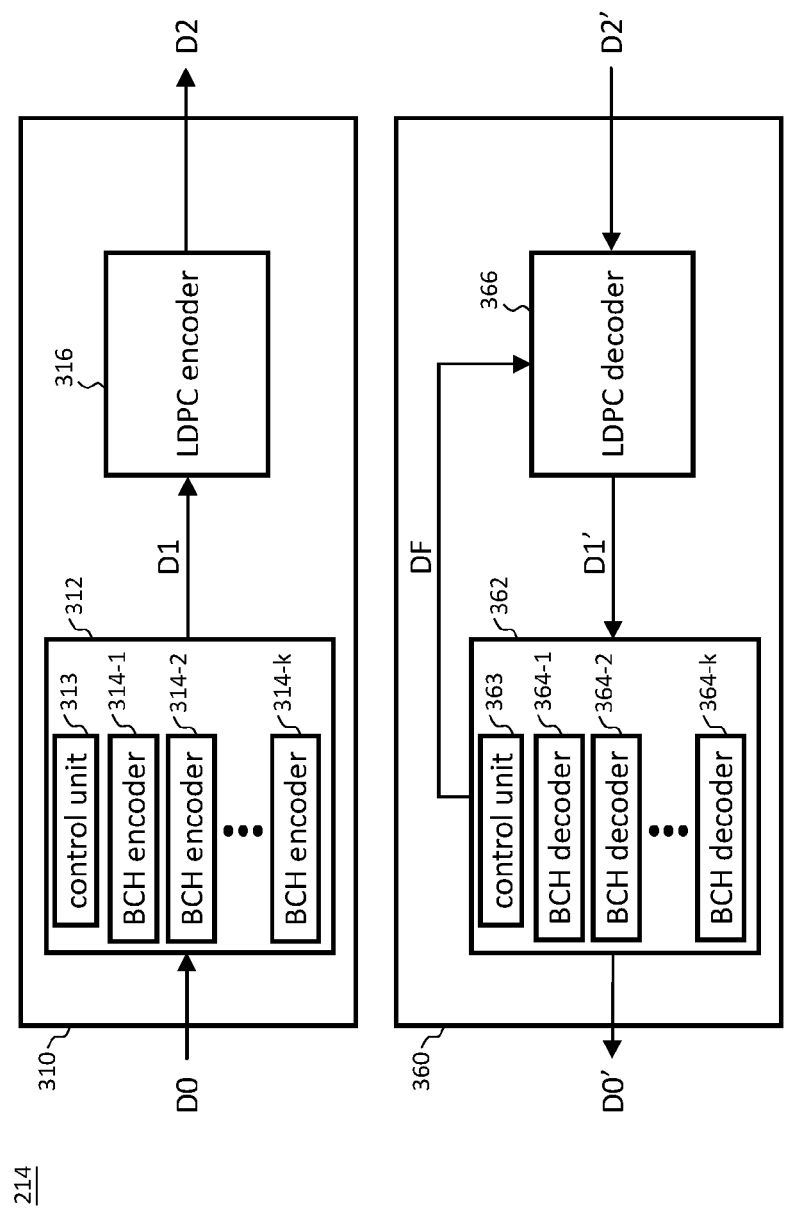
FIG. 3 illustrates a detailed functional block diagram of the ECC unit.
Figure 4:
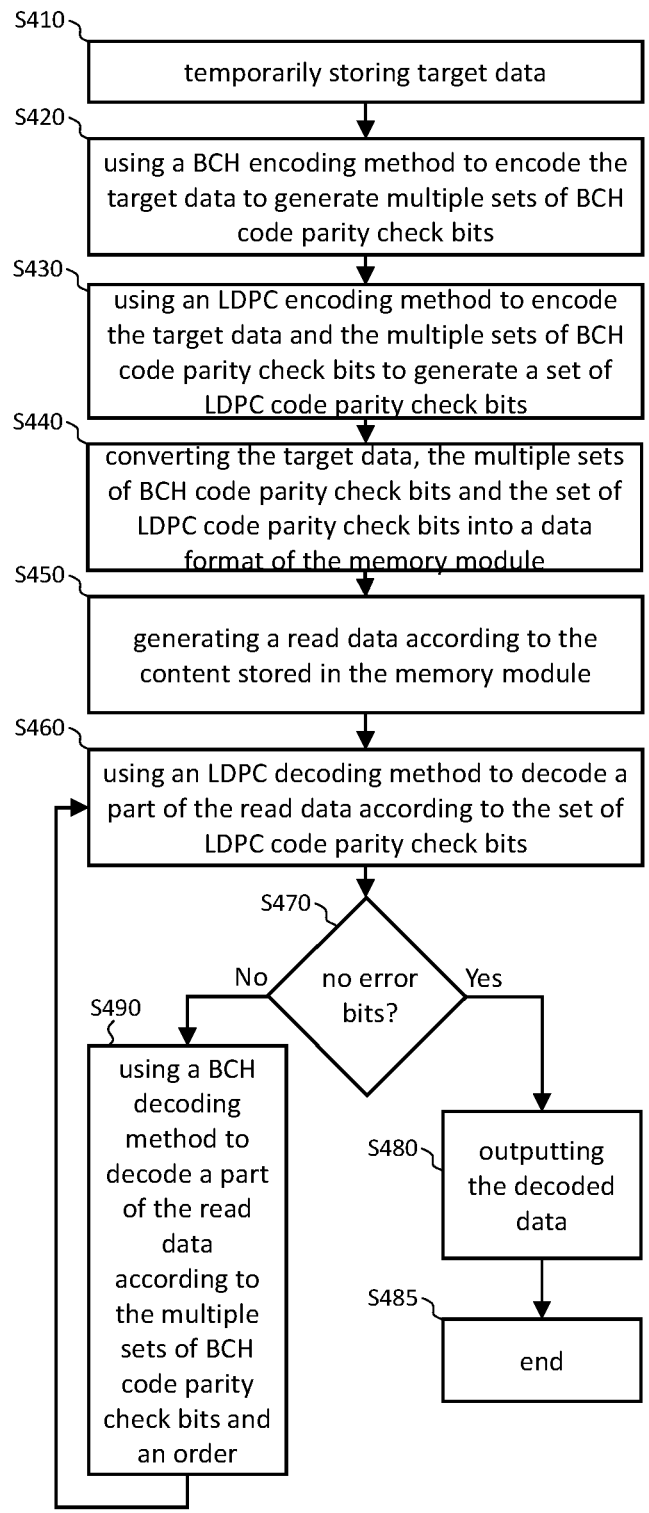
FIG. 4 illustrates a flowchart of the method of controlling a memory module.

FIG. 3 illustrates a detailed functional block diagram of the ECC unit 214, and FIG. 4 illustrates a flowchart of the method of controlling a memory module. The ECC unit 214 includes an ECC encoding circuit 310 and an ECC decoding circuit 360. The ECC encoding circuit 310, which includes a BCH encoding module 312 and an LDPC encoder 316, performs an ECC encoding operation on the data in a process of writing the data into the memory module 220. The BCH encoding module 312 includes a control unit 313 and k (k>1) BCH encoders 314. In the step S410, the target data D0 are temporarily stored in the storage unit 212; then in the step S420 the target data D0 enters the BCH encoding module 312 and an encoding operation is performed on the target data D0 by the multiple BCH encoders 314 to generate multiple sets of BCH code parity check bits. In this step, the control unit 313 divides the target data D0 according to the code lengths of the BCH encoders 314 such that the BCH encoders 314 receive corresponding amounts of data related to their respective code lengths. The code length here is the data amount processed by a BCH encoder 314 plus the length of its generated parity check bits; for example, assuming that the amount of the original data processed by a BCH encoder 314 is 16384 bits and a correction capability of the BCH encoder 314 is 120 bits, and based on the characteristic of the BCH encoder/decoder: $N+m \times T \leq 2^m$, where N is the amount of the original data, m is the order of the BCH encoder/decoder, T is the correction capability of the BCH encoder/decoder, a length of the parity check bits of the BCH encoder 314 is 15×120=1800 with the order m being 15; namely, the code length of the BCH encoder 314 is 16384+1800=18184 bits. The fact that the code lengths of the BCH encoders 314 are different means that the lengths of the original data processed by the BCH encoders 314 or the lengths of the parity check bits generated by the BCH encoders 314 are different. The k BCH encoders 314 have at least two kinds of code lengths. In one embodiment, all the k BCH encoders 314 have different code lengths; in another embodiment where k is larger than 2, two of the code lengths can be identical. Therefore, the control unit 313 divides the target data D0 according to the code lengths of the BCH encoders 314. For example, assuming that the BCH encoding module 312 includes 4 BCH encoders 314, which are capable of processing original data of data length being 1024 bits, 2048 bits, 4096 bits and 8192 bits, respectively, the target data D0 of data length 15360 bits will be divided into data of the 4 lengths. The BCH encoders 314 generate their respective set of parity check bits (PB1, PB2, . . . , PBk) after their encoding processes are complete. Finally, the k sets of parity check bits and the target data D0 are combined into data D1 by the control unit 313 and the data D1 is then sent to the LDPC encoder 316. Subsequently, in the step S430, the LDPC encoder 316 encodes the data D1 to generate corresponding set of parity check bits (PBL). Finally, all the data, including the target data D0, k sets of parity check bits PB1~PBk generated by the BCH encoder 314 and the set of parity check bits PBL generated by the LDPC encoder 316, are combined into data D2 and then output. In the step S440, the data D2 are converted into data formats of the memory module 220 by the read/write control unit 216.

The ECC decoding circuit 360, which includes a BCH decoding module 362 and an LDPC decoder 366, performs an ECC decoding operation on the data in a process of reading the data from the memory module 220. The BCH decoding module 362 includes a control unit 363, and k BCH decoders 364. In the step S450, the read/write control unit 216 generates data D2' according to the content of the memory module 220 as data are being read. The data D2' is then decoded by the LDPC decoder 366. The data D2' are mostly identical to the content of the data D2 except for potential several error bits. In the step S460, the LDPC decoder 366 decodes a part of the data D2', which corresponds to the target data D0 and the multiple sets of BCH code parity check bits PB1~PBk and may include several error bits, based on the set of LDPC code parity check bits PBL in the data D2' and generates data D1' after the decoding process. The data D1' includes the target data D0' decoded by the LDPC decoder 366 and the multiple sets of BCH code parity check bits PB1~PBk. In the step S470, the control unit 363 determines whether there are no error bits in the decoded target data D0'. The determination process can be done according to the target data D0' or according to a control signal (not shown) from the LDPC decoder 366, which indicates whether there are still error bits in the target data D0'. If there are no error bits, the control unit 363 removes the multiple sets of BCH code parity check bits PB1~PBk from the data D1' and then outputs the target data D0', which are essentially identical to the target data D0, to finish the ECC encoding/decoding process (steps S480 and S485); if, however, there are still error bits in the target data D0', in a step S490 following the step S470 the control unit 363 selects one of the BCH decoders 364 to perform the BCH code decoding operation on a part of the data D1' that does not include the BCH code parity check bits PB1~PBk according to a corresponding set of BCH code parity check bits PBx (1≤x≤k). After that, the control unit 363 generates the feedback data DF by combining the processed data in the BCH code decoding process and the multiple sets of BCH code parity check bits PB1~PBk and sends the feedback data DF to the LDPC decoder 366. In the step S460, the LDPC decoder 366 decodes the feedback data DF according to the set of LDPC code parity check bits PBL to generate the data D1' again.

Although the LDPC code has a better correction capability than the BCH code for the same length of parity check bits, the LDPC code cannot guarantee that all error bits can be corrected, which is the reason why the error floor region exists. On the other hand, the BCH encoder 314 guarantees its error correcting performance of ECC; to be specific, if the number of error bits is not beyond its correction capability, corrections to the error bits are guaranteed. This invention uses concatenated BCH code encoder/decoder and LDPC code encoder/decoder to improve the correctness in data and features the different code lengths of the multiple BCH encoders 314 and the BCH decoders 364. In the step S490 when the decoding process is being conducted, the BCH decoding module 362 selects a corresponding BCH decoder 364 to perform decoding according to the order of the code lengths of the BCH decoders 364. For example, assuming that the BCH decoders 364-1~364-k are in an ascending order of code length (i.e., the BCH decoder 364-1 has the smallest code length while the BCH decoder 364-k has the largest), the BCH decoder 364-1 with the smallest code length is selected when the BCH code is first employed for decoding and the remaining BCH decoders 364-2~364-k are used in order in the subsequent decoding processes. There is a reason for such design. Because the error bits can be corrected consecutively in a number of recursive decoding processes, the probability of successfully correcting the error bits can be greatly improved. On the other hand, in the conventional BCH code encoders/decoders of the same code length, each BCH code encoder/decoder is likely to accumulate too many error bits for the same data amount, resulting in a situation that all the BCH code decoders are not able to correct the error bits. The order of selecting the BCH decoders 364 (i.e., the order of referring to the multiple sets of BCH code parity check bits PB1~PBk) is not limited to the ascending order of code length, and can be a descending order of code length or other preferable orders.

Figure 5:
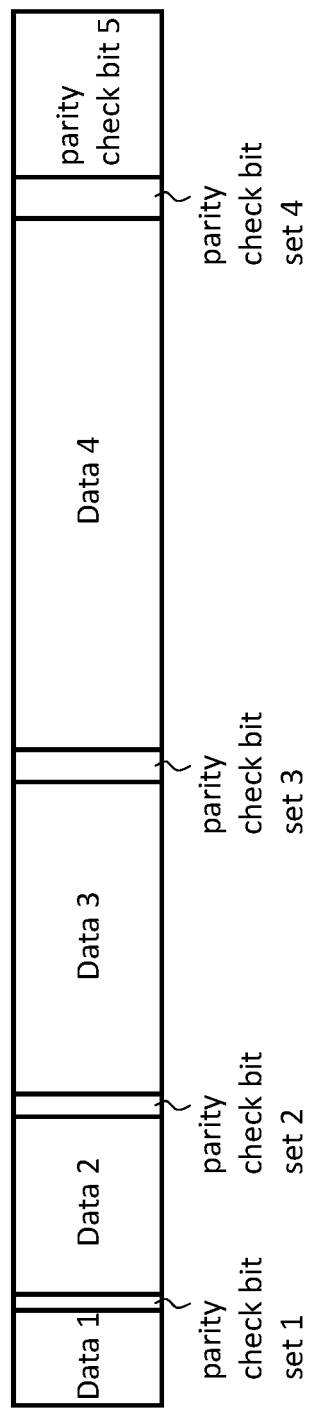
FIG. 5 illustrates a structure of the data D2 generated by the ECC unit according to an embodiment of the present invention.

In general, the memory module 220 has a limitation to the length of the parity check bits. Therefore, for a single access, a total length of the multiple sets of the parity check bits PB1~PBk of the BCH encoders 314 and the set of parity check bits PBL of the LDPC encoder 316 has a total number of bits smaller than or equal to the length of the parity check bits provided by the memory module 220. In addition, as mentioned earlier the LDPC code has a better correction capability than the BCH code for the same length of parity check bits so in one embodiment the length of the set of the LDPC code parity check bits PBL is designed to be greater than a half of the entire parity check bits of the data D2; that is, the length of the set of the LDPC code parity check bits PBL is designed to be greater than the total length of all the sets of the BCH code parity check bits PB1~PBk in the data D2. FIG. 5 illustrates a structure of the data D2 generated by the ECC unit according to an embodiment of the present invention. It is assumed here that the BCH encoding module 312 includes 4 BCH encoders 314 and the BCH decoding module 362 includes 4 BCH decoders 364. The data D2 includes data 1 to data 4, collectively data D0, and 5 sets of parity check bits 1~5. The parity check bit sets 1~4 correspond respectively to the sets of the BCH code parity check bits of the data 1~4, whereas the parity check bit set 5 is the set of the LDPC code parity check bits. In one embodiment, the lengths of the data 1~4 are 1024 bits, 2048 bits, 4096 bits and 8192 bits, respectively (i.e., the length of the data D0 is 1024+2048+4096+8192=15360 bits); thus the orders of the corresponding BCH code encoders/decoders are 11, 12, 13 and 14, respectively. It is further assumed that the error correction capability of each BCH code encoder/decoder is 3 bits, and thus the lengths of the parity check bit sets 1~4 are 33 bits, 36 bits, 39 bits and 42 bits, respectively (the total length being 33+36+39+42=150 bits). The length of the parity check bit set 5 is 1064 bits, which is larger than the total length of the parity check bit sets 1~4. Note that a combination of the data 1~4 and the parity check bit sets 1~4 is the data D1.

Figure 6:
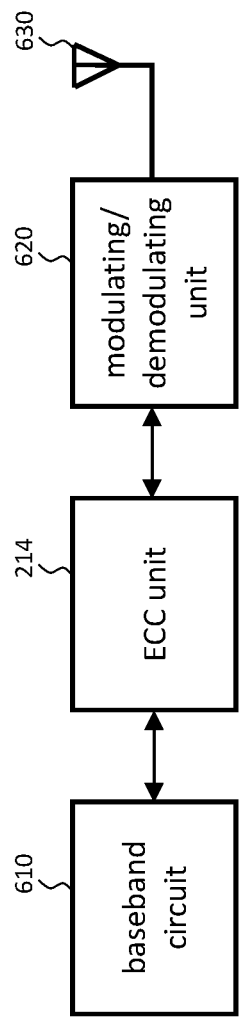
FIG. 6 illustrates a functional block diagram of a transmitting end or a receiving end of a communication system.
Figure 7:
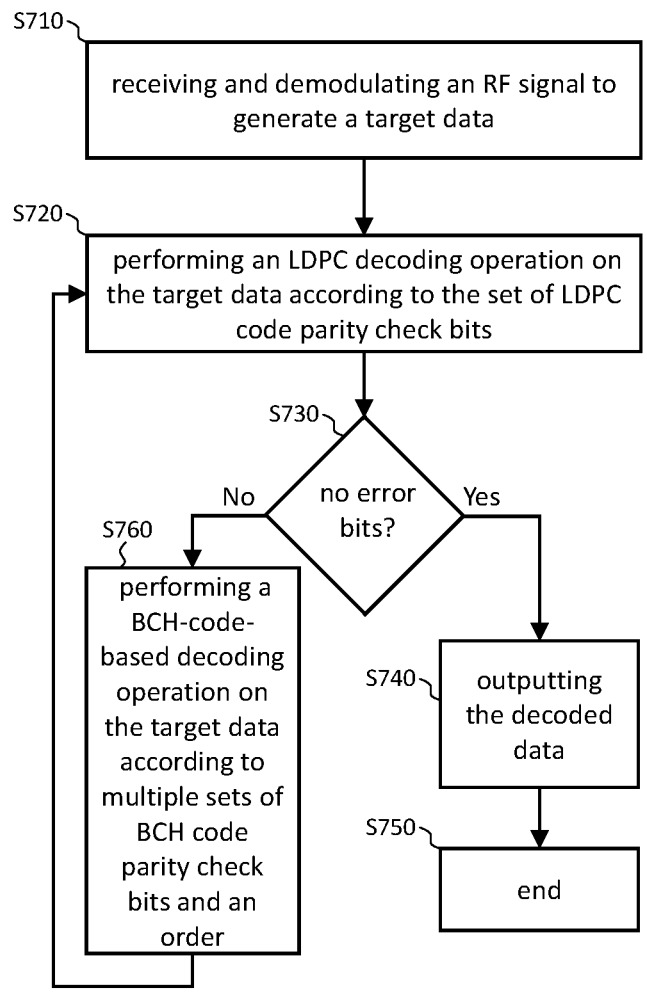
FIG. 7 illustrates a flowchart of an ECC decoding method of this invention.

In addition to a memory module, the ECC unit 214 of the present invention can also be applied to a communication system that employs the BCH code and the LDPC code. FIG. 6 illustrates a functional block diagram of a transmitting end or a receiving end of a communication system. When the ECC unit 214 is applied to the transmitting end, the target data generated by the baseband circuit 610 are encoded by the ECC unit 214 (in this case, the ECC unit 214 may include the ECC encoding circuit 310 only) and then modulated by the modulating/demodulating unit 620 (in this case, the modulating/demodulating unit 620 may include the modulating circuit only) before transmitted via the antenna 630. For applications in the transmitting end, a flowchart of the ECC encoding method of this invention is similar to the steps S420~S440 in FIG. 4, except that in the step S440 the conversion of data format is replaced by signal modulation. On the other hand, when the ECC unit 214 is applied to the receiving end, a flowchart of the ECC decoding method is illustrated in FIG. 7. In the step S710, the modulating/demodulating unit 620 demodulates the RF (radio frequency) signal received via the antenna 630 (in this case, the modulating/demodulating unit 620 may include the demodulating circuit only) to generate the target data, which is then decoded by the ECC unit 214 (in this case, the ECC unit 214 may include the ECC decoding circuit 360 only). The target data includes a message part transmitted from the transmitting end, one set of LDPC code parity check bits PBL and multiple sets of BCH code parity check bits PB1~PBk. In the step S720, the LDPC decoder 366 performs the LDPC code decoding operations on the target data based on the set of LDPC code parity check bits PBL. In the step S730, the control unit 363 determines whether there are no error bits. If affirmative, in the steps S740 and S750, the parity check bit parts in the target data are removed before the decoded message part is outputted to finish the decoding process; if, however, there are still error bits, in the step S760 the BCH decoding module 362 performs BCH-code-based decoding operations on the message part. The order according to which the control unit 363 selects the BCH decoders 364 can be referred to the aforementioned embodiment and the structure of the target data can be referred to FIG. 5. Note that a communication system usually utilizes a Reed-solomon code encoding/decoding operation; in fact, the Reed-solomon code is a special case of the BCH code so the ECC unit 214 is also suitable for the operations of the Reed-solomon code.

Figure 8:
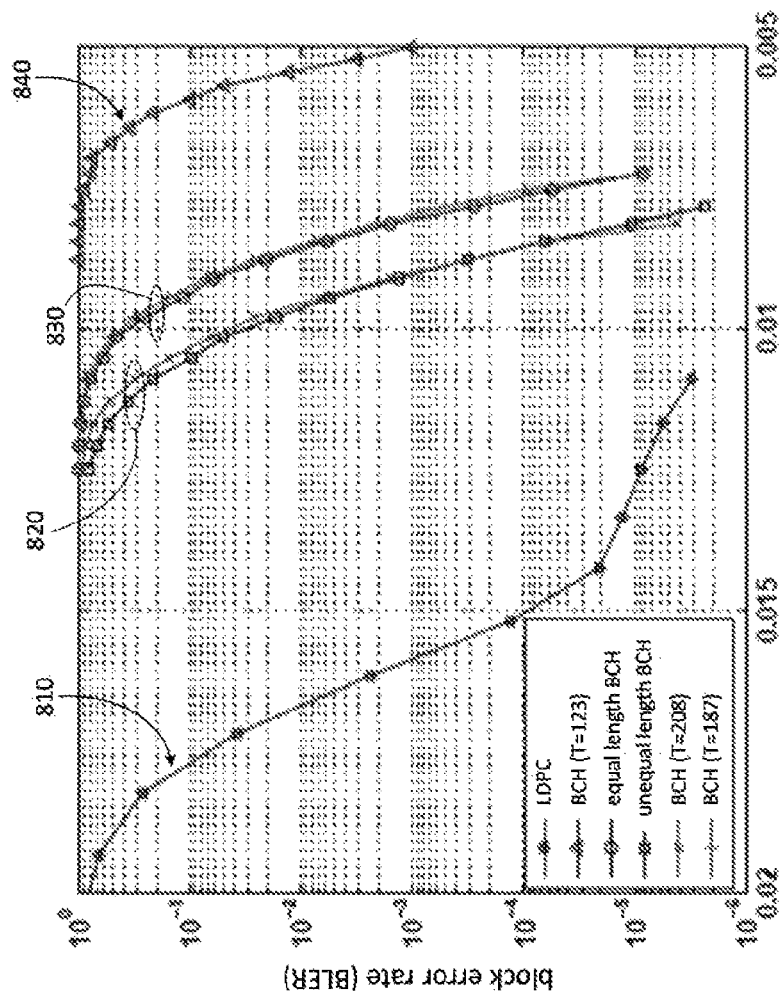
FIG. 8 illustrates the relationship between the block error rate (BLER) and the raw BER for the method disclosed herein and a conventional method as applied to memories.

FIG. 8 illustrates the relationship between the block error rate (BLER) and the raw BER for the method disclosed herein and a conventional method as applied to memories. In this figure, a curve closer to the left has a better error correction capability, implying that the memory has a longer service life. The curve 810 is related to a sole LDPC code encoder/decoder while the curve 840 is related to a sole BCH code encoder/decoder with an error correction capability T=123 bits. As mentioned earlier, the LDPC code generally has a better error correction capability than the BCH code, but unfortunately the curve 810 shows an error floor region in the figure, which is below the turning point where the BLER is about $10^{-5}$. The curve 830 presents actually two curves which are almost superimposed; one of them is related to a circuit having multiple BCH code encoders/decoders of the same code length concatenated with one LDPC code encoder/decoder; the other is related to a circuit having a sole BCH code encoder/decoder with an error correction capability T=187 bits; their performances are very close. Obviously, a circuit having multiple BCH code encoders/decoders of the same code length concatenated with one LDPC code encoder/decoder, which is corresponding to the curve 830, is better than a circuit having a sole BCH code encoder/decoder with an error correction capability T=123 bits, which is corresponding to the curve 840. The curve 820 presents actually two curves which are almost superimposed; one of them is related to a circuit having multiple BCH code encoders/decoders of different code lengths concatenated with one LDPC code encoder/decoder; the other is related to a circuit having a sole BCH code encoder/decoder with an error correction capability T=208 bits; their performances are very close. Obviously, a circuit having multiple BCH code encoders/decoders of different code lengths concatenated with one LDPC code encoder/decoder, which is corresponding to the curve 820, is better than a circuit having multiple BCH code encoders/decoders of the same code length concatenated with one LDPC code encoder/decoder, which is corresponding to the curve 830. In addition, the curve corresponding to the present invention does not show an error floor region, which means that this invention improves the limited error correction capability of the LDPC code.

Figure 9:
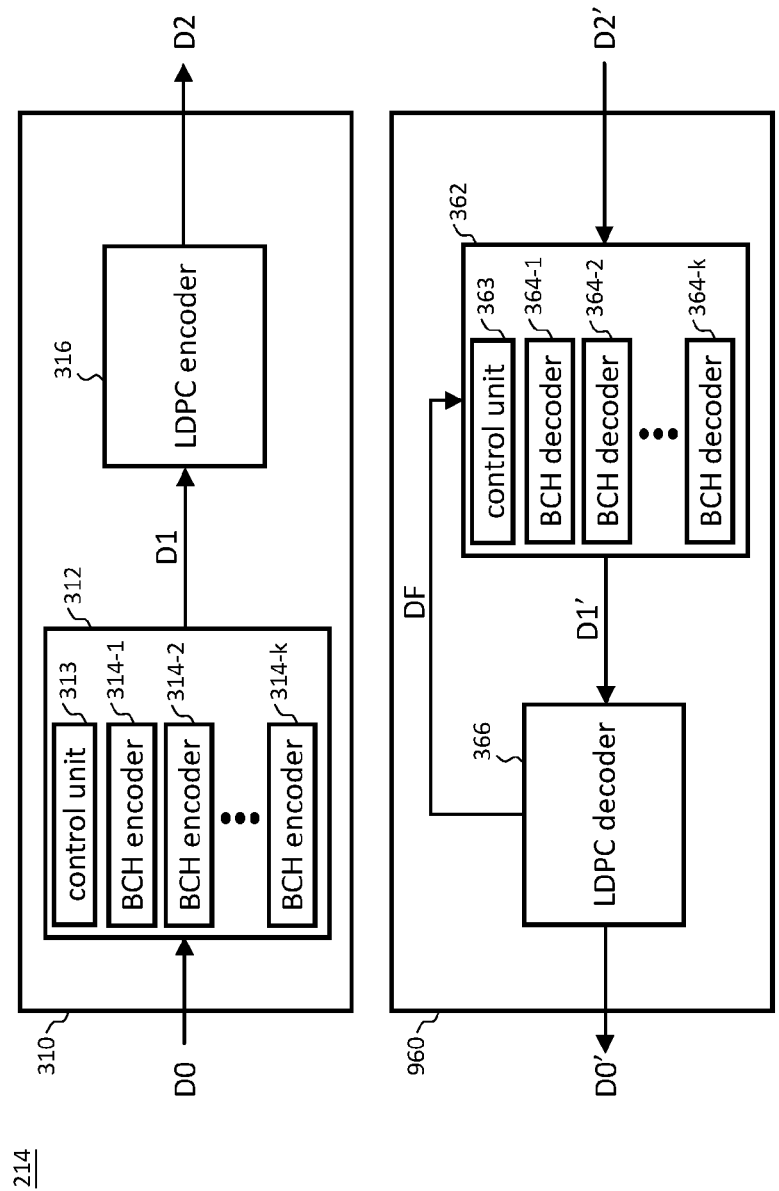
FIG. 9 illustrates a detailed functional block diagram of the ECC unit 214 according to another embodiment of this invention.
Figure 10:
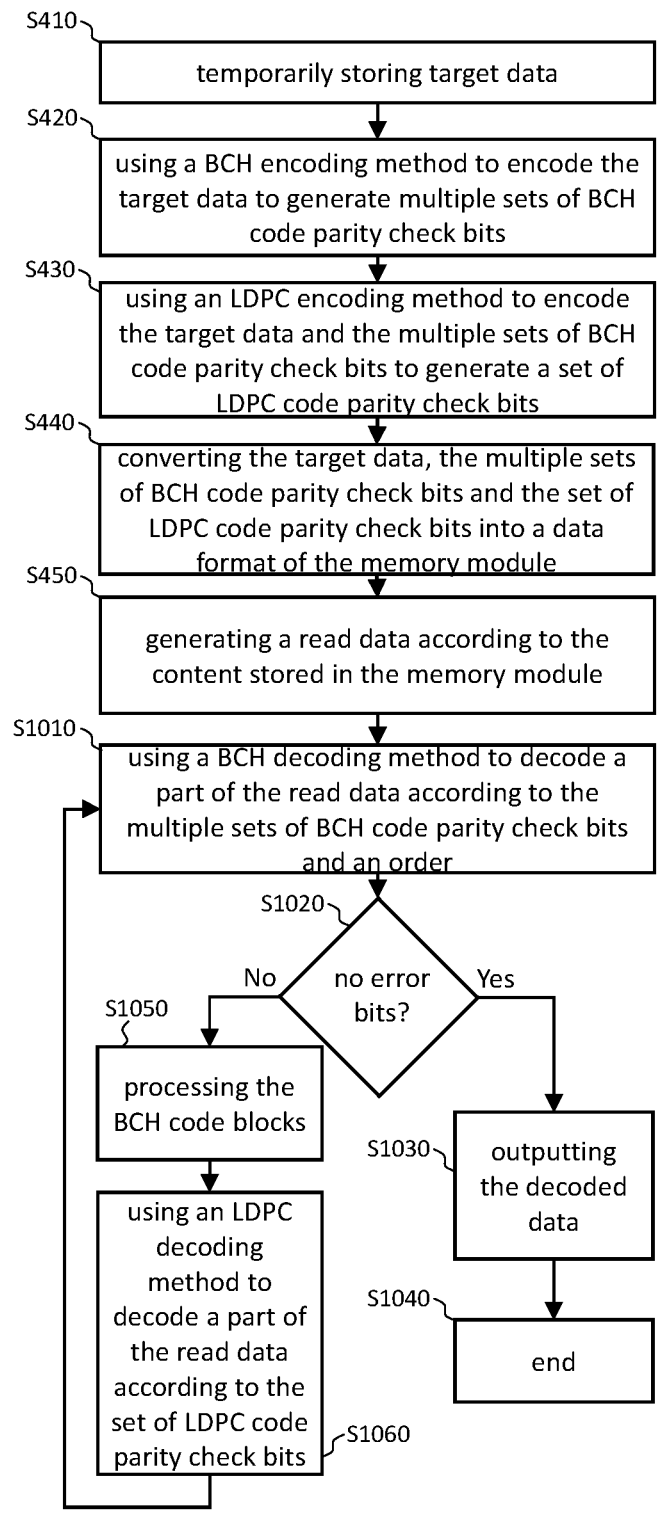
FIG. 10 illustrates a flowchart of a corresponding method of controlling a memory module.
Figure 11:
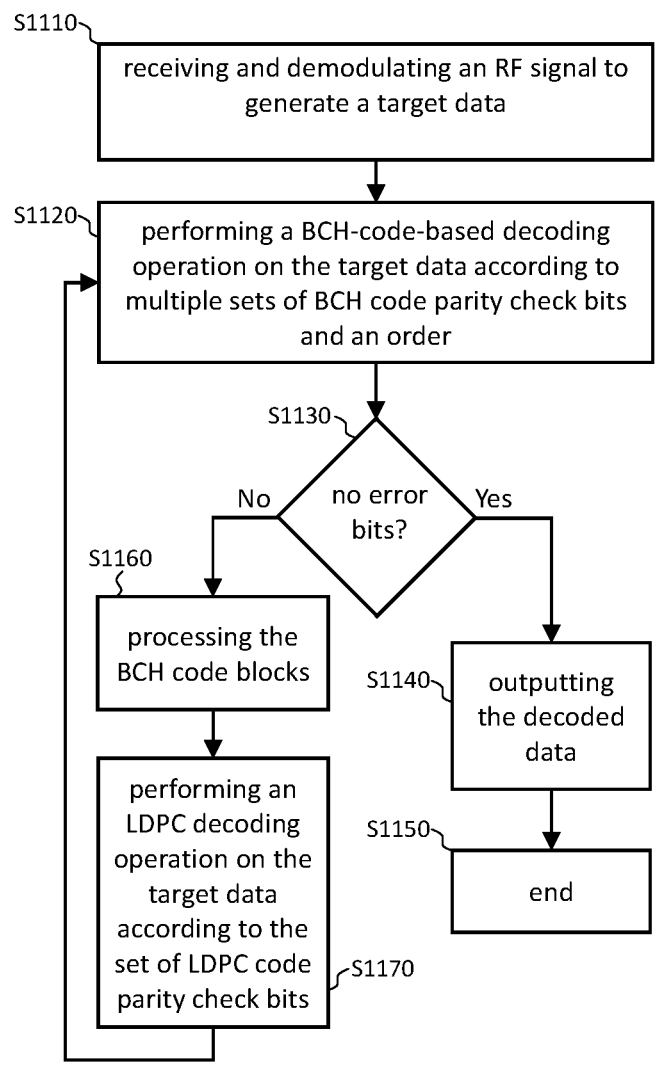
FIG. 11 illustrates a flowchart of an ECC decoding method applied to a receiving end of a communication system according to another embodiment of this invention.

In the decoding operation, this invention can perform the BCH code decoding operation before the LDPC code decoding operation. FIG. 9 illustrates a detailed functional block diagram of the ECC unit 214 according to another embodiment of this invention, and FIG. 10 illustrates a flowchart of a corresponding method of controlling a memory module. In the encoding operation, the target data are temporarily stored (step S410) before an encoding process performed by the BCH encoding module 312 (step S420) followed by an encoding process performed by the LDPC encoder 316 of the ECC encoding circuit 310 (step S430), and the subsequent step S440 is the same as that in FIG. 4. In the decoding process, the data D2' are read from the memory module 220 (step S450) and then are decoded by the BCH decoding module 362 of the ECC decoding circuit 960 according to an order (step S1010). In the first-time decoding process, the control unit 363 controls all the BCH decoders 364 to decode the data D2'. If the decoded data are correct, namely no error bits left (step S1020), the BCH decoding module 362 removes multiple sets of BCH code parity check bits from the data D2' and the LDPC decoder 366 removes the set of LDPC code parity check bits from the data D1'. Finally the decoded data are outputted (step S1030) before the decoding process finishes (step S1040). If, however, there is(are) still error bit(s) in the decoded data after the step S1010, the BCH code blocks are processed first (step S1050), i.e., correcting the error bits that can be corrected by the BCH code, to generate the data D1' and then the data D1' are decoded by the LDPC decoder 366 to generate the feedback data DF (step S1060). After that the BCH decoding module 362 decodes the feedback data DF again (step S1010) when the control unit 363 controls the BCH decoders 364 sequentially to perform the decoding process according to the order mentioned in the step S490. Specifically, the order mentioned in the step S1010 includes using all the BCH decoders 364 to decode for the first time and the order followed in the subsequent iteration operation. FIG. 11 illustrates a flowchart of an ECC decoding method applied to a receiving end of a communication system according to another embodiment. The demodulated target data generated in the step S1110 are decoded in a BCH-code-based decoding operation (step S1120) before an LDPC code decoding operation (step S1170). The details of each step in FIG. 11 are disclosed in the descriptions of FIG. 10 and are therefore omitted for brevity. The above embodiment that performs the BCH code decoding operation before the LDPC code decoding operation includes at least the following benefits: (1) less time spent on the step S1010 (or the step S1120) than the step S460 (or the step S720) if the decoding process succeeds at the first time because the decoding speed of the BCH code is generally faster than that of the LDPC code; (2) a termination condition of the entire decoding process being determined by the BCH code decoding process, which alleviates the influences of the error floor region.

Since people of ordinary skill in the art can appreciate the implementation detail and the modification thereto of the method inventions of FIGS. 4 and 7 through the disclosure of the device inventions of FIGS. 2, 3 and 6, and the implementation detail and the modification thereto of the method inventions of FIGS. 10 and 11 through the disclosure of the device invention of FIG. 9, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A memory control module for controlling data access of a memory module, comprising:
 a storage unit for receiving and storing a target data to be stored in the memory module;
 an error correcting code (ECC) unit, coupled to the storage unit to receive the target data, comprising:
  a first Bose-Chaudhuri-Hocquenghem (BCH) code encoder, encoding the target data to generate a first set of BCH code parity check bits, wherein the first set of BCH code parity check bits has a first length;
  a second BCH code encoder, encoding the target data to generate a second set of BCH code parity check bits, wherein the second set of BCH code parity check bits has a second length different from the first length; and
  a Low Density Parity Check (LDPC) code encoder, coupled to the first BCH code encoder and the second BCH code encoder to receive the target data, the first set of BCH code parity check bits, and the second set of BCH code parity check bits from the first BCH code encoder and the second BCH code encoder, encoding the target data, the first set of BCH code parity check bits, and the second set of BCH code parity check bits to generate a set of LDPC code parity check bits; and a read/write control unit, coupled to the ECC unit, for converting the target data, the first set of BCH code parity check bits, the second set of BCH code parity check bits, and the set of LDPC code parity check bits into a data format of the memory module before writing the target data, the first set of BCH code parity check bits, the second set of BCH code parity check bits, and the set of LDPC code parity check bits into the memory module;

wherein a total length of the first set of BCH code parity check bits and the second set of BCH code parity check bits is smaller than the length of the set of LDPC code parity check bits;

wherein the read/write control unit generates a read data according to a content stored in the memory module and the read data comprises an intermediate data, the first set of BCH code parity check bits, the second set of BCH code parity check bits, and the set of LDPC code parity check bits, and the ECC unit further comprises:

a first BCH code decoder for decoding the intermediate data according to the first set of BCH code parity check bits to correct an error bit in the intermediate data;

a second BCH code decoder for decoding the intermediate data according to the second set of BCH code parity check bits to correct an error bit in the intermediate data; and an LDPC code decoder, coupled to the first BCH code decoder and the second BCH code decoder, for decoding the intermediate data according to the set of LDPC code parity check bits to correct an error bit in the intermediate data.

2. The memory control module of claim 1, wherein the LDPC code decoder processes the intermediate data prior to the first BCH code decoder and the second BCH code decoder.

3. The memory control module of claim 1, wherein the first BCH code decoder and the second BCH code decoder process the intermediate data prior to the LDPC code decoder.

4. The memory control module of claim 1, further comprising:

a control unit, coupled to the first BCH code decoder and the second BCH code decoder, for controlling a decoding sequence of the first BCH code decoder and the second BCH code decoder according to an order.

5. The memory control module of claim 4, wherein the order is related to an order of code lengths of the first BCH code decoder and the second BCH code decoder.

6. The memory control module of claim 1, wherein the total length of the first set of BCH code parity check bits, the second set of BCH code parity check bits, and the set of LDPC code parity check bits is smaller than or equal to the length of multiple parity check bits provided by the memory module.

7. The memory control module of claim 6, wherein the memory module is a flash memory module.

8. A control method for controlling a memory module, comprising:

receiving and storing a target data to be stored in the memory module;

using a first Bose-Chaudhuri-Hocquenghem (BCH) code encoding method to encode the target data to generate a first set of BCH code parity check bits, wherein the first set of BCH code parity check bits has a first length;

using a second BCH code encoding method to encode the target data to generate a second set of BCH code parity check bits, wherein the second set of BCH code parity check bits has a second length different from the first length;

using a Low Density Parity Check (LDPC) code encoding method to encode the target data, the first set of BCH code parity check bits, and the second set of BCH code parity check bits to generate a set of LDPC code parity check bits; and converting the target data, the first set of BCH code parity check bits, the second set of BCH code parity check bits, and the set of LDPC code parity check bits into a data format of the memory module before writing the target data, the first set of BCH code parity check bits, the second set of BCH code parity check bits, and the set of LDPC code parity check bits into the memory module;

wherein a total length of the first set of BCH code parity check bits and the second set of BCH code parity check bits is smaller than the length of the set of LDPC code parity check bits;

wherein the method further comprises:

generating a read data according to a content stored in the memory module, the read data comprising an intermediate data, the first set of BCH code parity check bits, the second set of BCH code parity check bits, and the set of LDPC code parity check bits;

using a first BCH code decoding method to decode the intermediate data according to the first set of BCH code parity check bits to correct an error bit in the intermediate data;

using a second BCH code decoding method to decode the intermediate data according to the second set of BCH code parity check bits to correct an error bit in the intermediate data; and using an LDPC code decoding method to decode the intermediate data according to the set of LDPC code parity check bits to correct an error bit in the intermediate data.

9. The method of claim 8, wherein the first BCH code decoding method and the second BCH code decoding method process the intermediate data prior to the LDPC code decoding method.

10. The method of claim 8, wherein the LDPC code decoding method processes the intermediate data prior to the first BCH code decoding method and the second BCH code decoding method.

11. The method of claim 8 further comprising:

decoding the intermediate data by referring to the first set of BCH code parity check bits and the second set.

12. The method of claim 11, wherein the order is related to a length order of the first set of BCH code parity check bits and the second set of BCH rode parity check bits.

13. The method of claim 8, wherein the total length of the first set of BCH code parity check bits, the second set of BCH code parity check bits, and the set of LDPC code parity check bits is smaller than or equal to the length of multiple parity check bits provided by the memory module.

14. The method of claim 13, wherein the memory module is a flash memory module.

* * * * *